(12) United States Patent
Kim et al.

(10) Patent No.: US 8,932,923 B2
(45) Date of Patent: Jan. 13, 2015

(54) SEMICONDUCTOR GATE STRUCTURE FOR THRESHOLD VOLTAGE MODULATION AND METHOD OF MAKING SAME

(71) Applicant: Globalfoundries, Inc., Grand Cayman, KY (US)

(72) Inventors: Hoon Kim, Clifton Park, NY (US); Kisik Choi, Hopewell Junction, NY (US)

(73) Assignee: GLOBALFOUNDRIES Inc., Grand Caymen (KY)

( * ) Notice: Subject to any disclaimer, the term of this patent is extended or adjusted under 35 U.S.C. 154(b) by 0 days.

(21) Appl. No.: 13/770,493

(22) Filed: Feb. 19, 2013

(65) Prior Publication Data
US 2014/0231922 A1    Aug. 21, 2014

(51) Int. Cl.
H01L 21/8238    (2006.01)
H01L 29/40    (2006.01)
H01L 29/49    (2006.01)

(52) U.S. Cl.
CPC .......... H01L 29/401 (2013.01); H01L 29/4966 (2013.01)

USPC .......................................... 438/216; 438/287

(58) Field of Classification Search
CPC ................. H01L 21/823857; H01L 21/28185; H01L 21/823462
USPC ......................................... 438/663, 216, 287
See application file for complete search history.

(56) References Cited

U.S. PATENT DOCUMENTS

2013/0203230 A1*    8/2013 Chen et al. .................... 438/287

* cited by examiner

*Primary Examiner* — Yu-Hsi D Sun
(74) *Attorney, Agent, or Firm* — Wayne F. Reinke, Esq.; Heslin Rothenberg Farley & Mesiti P.C.

(57) ABSTRACT

A gate structure of a semiconductor device having a NFET and a PFET, includes a lower layer of a hafnium-based dielectric over the gates of the NFET and PFET, and an upper layer of a lanthanide dielectric. The dielectrics are annealed to mix them above the NFET resulting in a lowered work function, and corresponding threshold voltage reduction. An annealed, relatively thick titanium nitride cap over the mixed dielectric above the NFET gate also lowers the work function and threshold voltage. Above the TiN cap and the hafnium-based dielectric over the PFET gate, is another layer of titanium nitride that has not been annealed. A conducting layer of tungsten covers the structure.

15 Claims, 5 Drawing Sheets

SEMICONDUCTOR GATE STRUCTURE FOR THRESHOLD VOLTAGE MODULATION AND METHOD OF MAKING SAME

BACKGROUND OF THE INVENTION

1. Technical Field

The present invention generally relates to semiconductor devices and methods of fabricating the same. More particularly, the present invention relates to fabrication of a semiconductor gate structure for modulation of threshold voltage by selectively annealing a work function material lacking aluminum.

2. Background Information

Controlling the threshold voltage (i.e., minimum turn-on voltage, Vth) of a transistor is a long-standing goal of transistor design. Currently, aluminum containing n-type metals are used for Vth control by controlling the thickness of the aluminum containing n-type metals. However, there are reliability concerns and higher gate leakage with the use of such metals, mainly stemming from the relatively low controllability of aluminum diffusion. Non-uniformity is also a concern, due to poor aluminum diffusion distribution. In addition, many aluminum containing materials used for atomic layer deposition and chemical vapor deposition, such as titanium aluminum carbide (TiAlC), tantalum aluminum carbide (TaAlC), have high resistivity (>1000 uOhm-cm) due to high carbon impurity content (~40 at. %) and poor threshold stability caused by the diffusion of aluminum into the high k dielectric areas, where the dielectric constant k>3.9 (k=3.9 for $SiO_2$). Thus, it would be helpful to have better transistor threshold voltage control than currently available using aluminum-based n-type metal.

SUMMARY OF THE INVENTION

The present invention provides, in a first aspect, a method, which includes providing a semiconductor device including a n-type transistor and a p-type transistor, creating a first dielectric layer of at least one first dielectric material over the semiconductor device, depositing a first layer of work function material lacking aluminum over the transistors, altering a work function of the first layer of work function material by annealing, and separating work functions of the transistors by removing the first layer of work function material over one of the transistors.

The present invention provides, in a second aspect, further reducing a work function of the n-type transistor. The further reducing includes annealing to combine over the n-type transistor a layer of a first dielectric material and a layer of a second dielectric material, the first dielectric material including a hafnium-based dielectric, and the second dielectric material including a lanthanum-based dielectric.

The present invention provides, in a third aspect, a semiconductor device. An intermediate structure of a semiconductor device includes a n-type transistor and p-type transistor, a dielectric layer including at least one dielectric material over the n-type transistor and p-type transistor, a first work function layer including a first work function material lacking aluminum that has been annealed over only the dielectric layer above the n-type transistor, a second work function layer including an unannealed second work function material lacking aluminum over the first work function layer and the dielectric layer over the p-type transistor, and a conducting layer including a conducting material over the second work function layer.

The present invention provides, in a fourth aspect, a semiconductor device. An intermediate structure of a semiconductor device includes a n-type transistor and p-type transistor, and a dielectric mixture layer over only the n-type transistor that has been annealed, the mixture including a hafnium-based dielectric material and a lanthanum-based dielectric material. The semiconductor device further includes a first dielectric layer including the hafnium-based dielectric material over the p-type transistor only, a first work function layer including a transition metal nitride lacking aluminum that has been annealed over only the dielectric mixture layer, a second work function layer including a transition metal nitride lacking aluminum over the first work function layer and the first dielectric layer, and a conducting layer including a conducting material over the third work function layer.

These, and other features and advantages of this invention will become apparent from the following detailed description of various aspects of the invention taken in conjunction with the accompanying drawings.

DETAILED DESCRIPTION OF THE INVENTION

Figure 4:
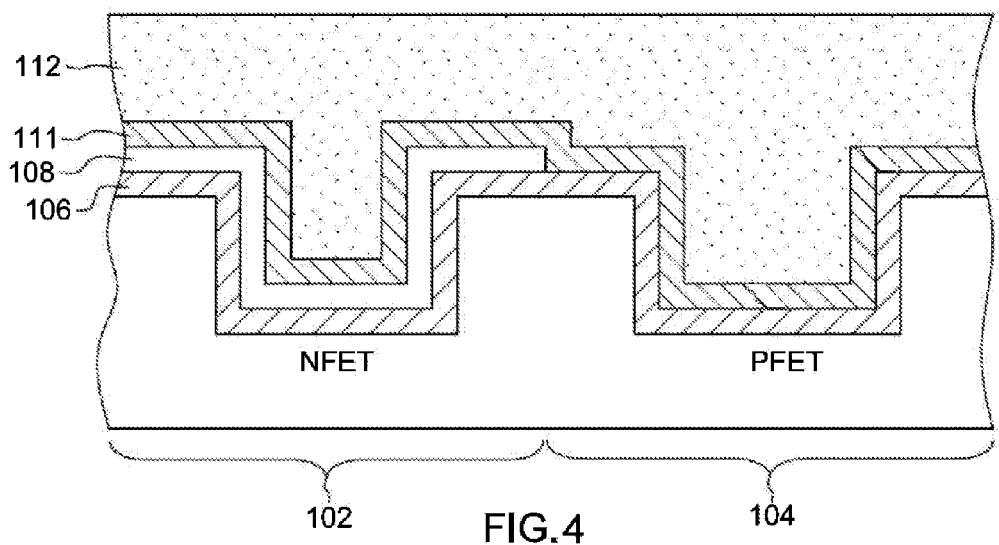
FIGS. 2-4 depict various fabrication stages of one example based on FIG. 1 of a semiconductor device gate structure providing threshold voltage modulation according to aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, such as additional fabrication steps and/or additional layers of materials, and/or different arrangements of certain disclosed layers, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding. The same reference numbers are used throughout different figures to designate the same or similar components.

In the present invention, the aluminum and carbon containing metals are replaced with work function materials lacking aluminum; preferably, a transition metal nitride, for example, those in Groups 4-6 of the Periodic Table, including, for example, titanium nitride (TiN), tantalum nitride (TaN), niobium nitride (NbN), vanadium nitride (VN), tungsten nitride (WN), and the like. Annealing the non-aluminum containing transition metal nitride lowers its work function as well as the corresponding NFET threshold voltage. As the present invention does not use any aluminum containing n-metal for the work function layers, it is expected to result in improved stability of the device over time, increasing the reliability of the device and lowering the distribution of threshold voltage (Vth) compared to aluminum containing n-metals. In addition, the lack of aluminum-based n-metal in the gate stack is expected to result in lower line resistance, more space in the gate trench for conductive metal and a simpler process.

The methods and devices of the present invention, in the following examples, provide modulation and separation of the work functions (and corresponding threshold voltages) of n-type and p-type transistors. Two basic approaches are used to achieve that goal. In one aspect, a relatively thick transition-metal-nitride-based work function material layer added above the n-type transistor gate is annealed to lower its work function by about 500 mV. In another aspect, annealing is used to combine a hafnium-based dielectric and a lanthanum-based dielectric, which again lowers the work function by about 100 mV to about 150 mV. The two aspects can be used together to create a work function separation of about 600 mV to about 650 mV between the n-type and p-type transistors, which correspondingly separates their threshold voltages.

Figure 1:
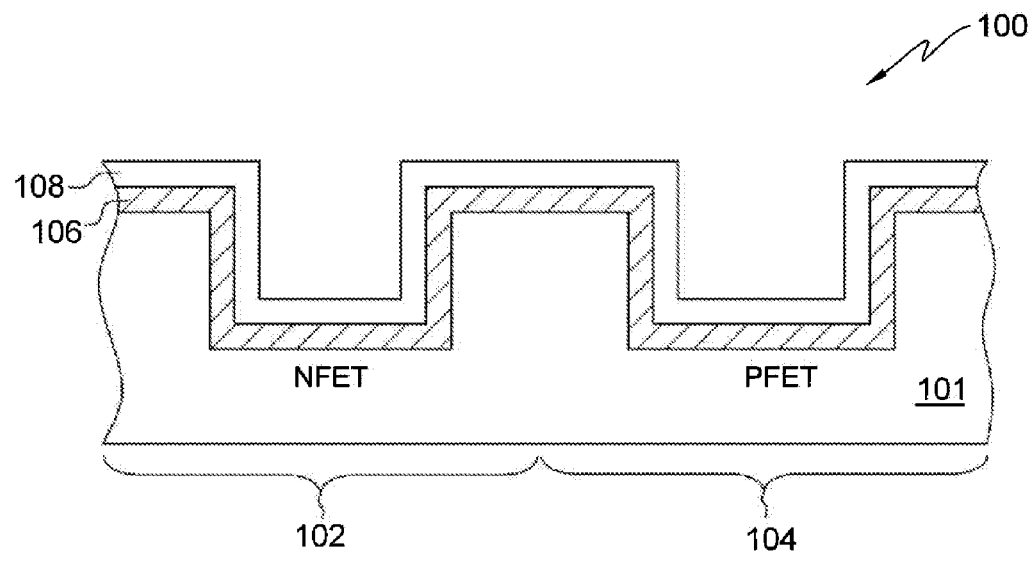
FIG. 1 depicts one example of a starting structure according to aspects of the present invention.

FIG. 1 illustrates an intermediate structure, generally denoted 100, obtained during fabrication of a gate structure of a semiconductor device. The gate structure of the present invention can be used, for example, in logic devices. The intermediate structure includes a substrate 101 of n-type and p-type doped silicon; in this example, included are gates of a n-type Field Effect Transistor (NFET) 102 and a p-type FET (PFET) 104. At the stage of fabrication depicted in FIG. 1, intermediate structure 100 includes a layer of high-k dielectric material 106 and a work function layer 108. The gate stack may be planar or three-dimensional, for example, a FinFET, which is a MOSFET designed with one or more source/drain/channel areas raised with respect to the substrate and covered by the gate. In the present example, the device is three-dimensional. The various layers depicted in the figures may be formed from a variety of different materials using a variety of techniques, such as, for example, atomic layer deposition (ALD) and chemical vapor deposition (CVD). The thickness of the layers may also vary, depending upon the particular application.

In one example, the dielectric material 106 includes a hafnium-based dielectric, such as, for example, hafnium oxide ($HfO_2$), hafnium silicate ($HfSiO_4$) or nitrided hafnium silicate (HfSiON), having a thickness of about 10 Angstroms to about 25 Angstroms that is initially formed preferably via an atomic layer deposition (ALD) process. ALD is preferred for FinFET devices, as it achieves a very high conformal deposition along with favorable thickness control in high-k dielectric areas. As used herein, "high-k dielectric" refers to a dielectric have a dielectric constant k of greater than 3.9 (k=3.9 for $SiO_2$).

The first work function layer 108 may be formed over the dielectric material 106 by performing, for example, an ALD process, and is chosen to avoid the inclusion of aluminum. Titanium nitride, for example, of a thickness of about 10 Angstroms to about 100 Angstroms, may be used. Other possible transition metal nitride work function materials lacking aluminum include those from Groups 4-6 in the Periodic Table, including, for example, tantalum nitride (TaN), niobium nitride (NbN), vanadium nitride (VN), tungsten nitride (WN), and the like.

Figure 2:
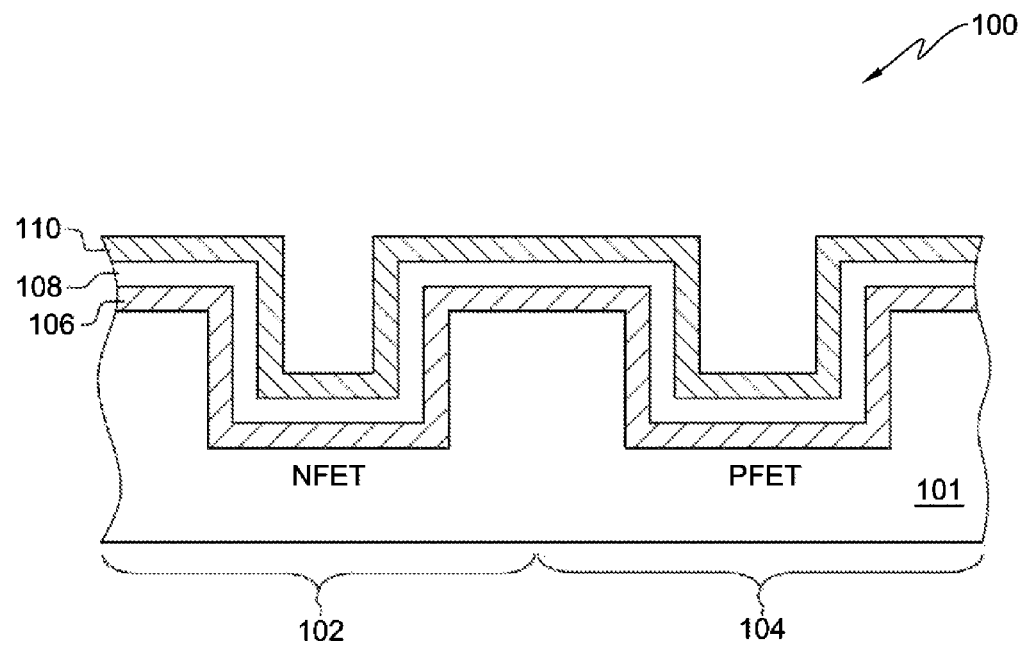

FIG. 2 depicts the structure of FIG. 1 after deposition of a layer of amorphous silicon or polysilicon 110, having a thickness of about 20 Angstroms to about 400 Angstroms, and which may be formed over the first work function layer using, for example, a chemical vapor deposition process. The polysilicon layer acts as an oxygen barrier during annealing.

After deposition of the polysilicon layer, the structure is then annealed to lower the work function of the first work function layer. In one example, Laser Spike Annealing is used at a temperature of about 900° C. to about 1100° C. for a non-zero time period of, for example, less than about one minute. Lowering the work function of the first work function layer 108 causes a corresponding threshold voltage downward shift of about 500 mV. The annealing may be performed using techniques other than laser spike annealing, such as, for example, Rapid Thermal Annealing and Flash Lamp Annealing. The anneal time will vary for such techniques, from as short as a nanosecond up to about ten seconds. However, if the anneal temperature is less than about 950° C., then anneal time may increase up to about ten minutes.

Figure 3:
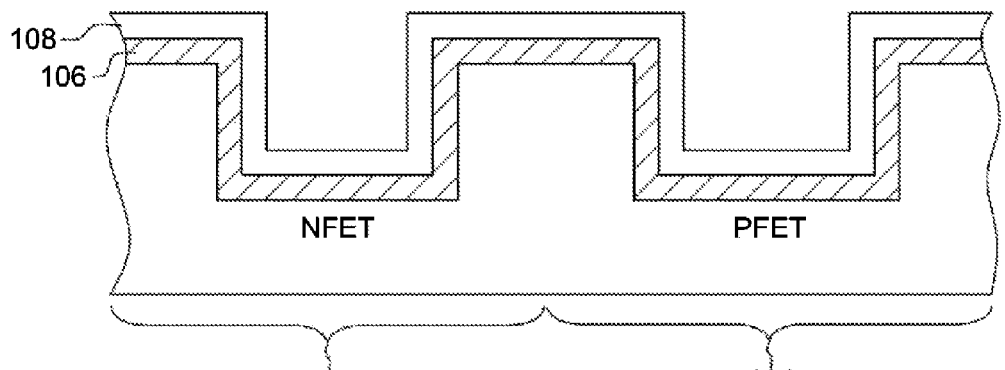

FIG. 3 illustrates, by way of example only, the removal of the amorphous silicon or polysilicon layer 110, after the anneal. The removal of layer 110 may be accomplished in multiple ways. In one example, the removal may be accomplished using an etching agent having an ammonia containing chemistry without touching the underlying first work function layer.

FIG. 4 illustrates, by way of example only, patterning the structure of FIG. 3 to remove the first work function layer 108 over the PFET gate, leaving a work-function cap on the NFET gate only, followed by deposition of a second work function layer 111 over the NFET and PFET that is not annealed. The second work function layer 111 is also preferably formed using atomic layer deposition (ALD) and, like the first work function layer, is a transition metal nitride that lacks aluminum, such as, for example, titanium nitride having a thickness of about 5 Angstroms to about 100 Angstroms. As a practical matter, the upper thickness limit is dictated by how thick a conducting layer is desired. A layer of the conducting material 112, for example, tungsten (W), aluminum (Al), nickel (Ni), cobalt (Co), titanium (Ti) or a salicide, is deposited over the second work function layer 111, preferably using CVD, to act as a gate filler and also to reduce the total resistivity of the device (i.e., improve conductivity). Generally, the conducting layer is preferably about 2000 Angstroms, but may be about 200 Angstroms to about 4000 Angstroms. In the case of the conducting material 112 being aluminum, the thickness of the second work function layer 111 preferably has a thickness of about 50 Angstroms to about 100 Angstroms to reduce the risk of aluminum diffusion.

In a variation of the aspect discussed above, depositing the dielectric layer(s) includes depositing a hafnium-based first dielectric layer lacking lanthanum over the gates, for example, dielectric materials including, for example, HfO2, HfSiO4 and HfSiON; depositing a third work function layer over the first dielectric layer; removing the third work function layer over the NFET gate only; and depositing a lanthanum-based second dielectric layer, for example, dielectric materials including lanthanum oxide ($La_2O_3$) and lanthanum silicate ($La_2SiO_5$), over the remainder of the first dielectric layer above the NFET gate and the exposed third work function layer over the PFET gate. As with the prior aspect, the third work function layer lacks aluminum and is preferably a transition metal nitride, for example, those from Groups 4-6 in the Periodic Table, including, for example, titanium nitride (TiN), tantalum nitride (TaN), niobium nitride (NbN), vanadium nitride (VN), tungsten nitride (WN), and the like. Also, preferably, all the work function layers are the same material.

Figure 5:
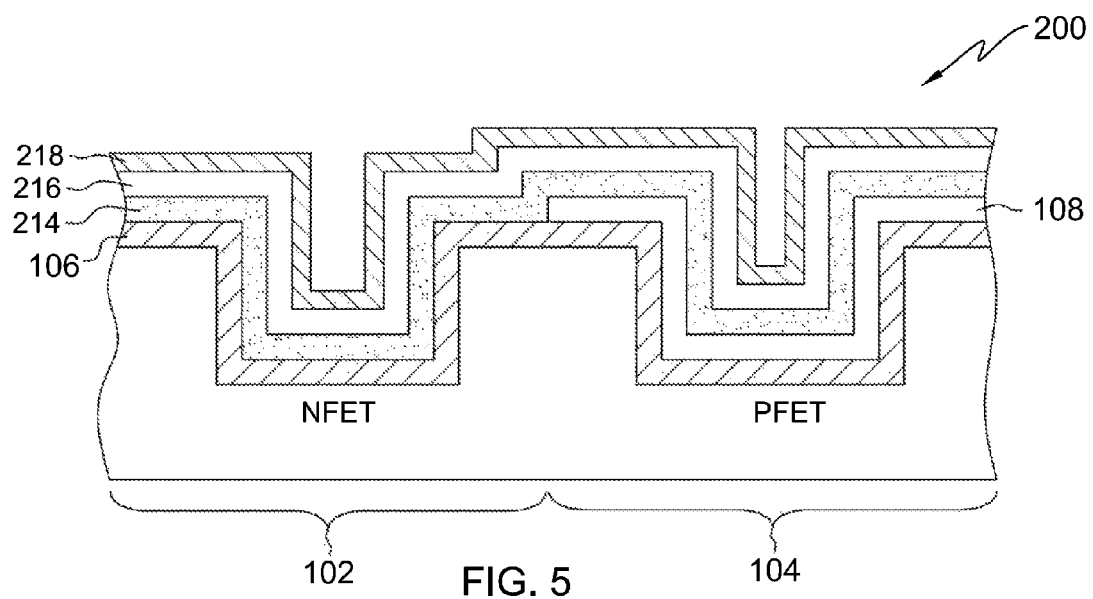
FIGS. 5-9 depict another example based on FIG. 1 of various fabrication stages of a semiconductor device gate structure providing threshold voltage modulation according to aspects of the present invention.

FIG. 5 illustrates, by way of example only, patterning the structure of FIG. 1 to remove the first work function layer 108 over the NFET gate 102, while leaving a work function material "cap" over the PFET gate 104 only, followed by deposition of a second dielectric material 214, preferably a lanthanum-based dielectric, for example, dielectric materials including $La_2O_3$ and $La_2SiO_5$, over the NFET gate and PFET gate work function cap. The layer of second dielectric material has a thickness of about 1 Angstrom to about 10 Angstroms, and may be deposited, for example, by performing an atomic layer deposition process. A second work function layer 216 is deposited over the second dielectric material, and includes a transition metal nitride lacking aluminum, such as, for example, titanium nitride, having a thickness of about 5 Angstroms to about 100 Angstroms and may be deposited by performing, for example, an atomic layer deposition (ALD) process. Other possible transition metal nitrides lacking aluminum include those from Groups 4-6 in the Periodic Table, including, for example, titanium nitride (TiN), tantalum nitride (TaN), niobium nitride (NbN), vanadium nitride (VN), tungsten nitride (WN), and the like. A layer of amorphous silicon or polysilicon 218 having a thickness of about 20 Angstroms to about 400 Angstroms is formed over the second work function layer using, for example, a chemical vapor deposition.

After deposition of layer 218, the structure is then annealed at a temperature of about 900° C. to about 1100° C. for a non-zero time period of less than about one minute using laser spike annealing. In the example, annealing diffuses the lanthanum-based dielectric into the hafnium-based dielectric in the NFET stack to combine the dielectric layers into a single layer 215 (see FIG. 6), such as, for example, hafnium lanthanum oxide. This diffusion causes a downward shift in the work function and corresponding threshold voltage of the NFET by about 100 mV to about 150 mV. The annealing may be performed using techniques other than laser spike annealing, such as, for example, Rapid Threshold annealing and Flash Lamp annealing.

Figure 6:
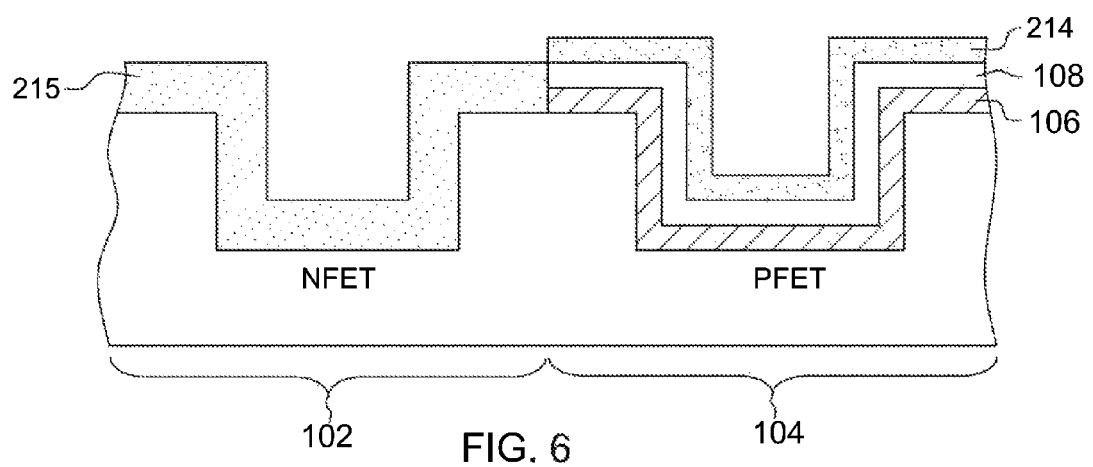
Figure 7:
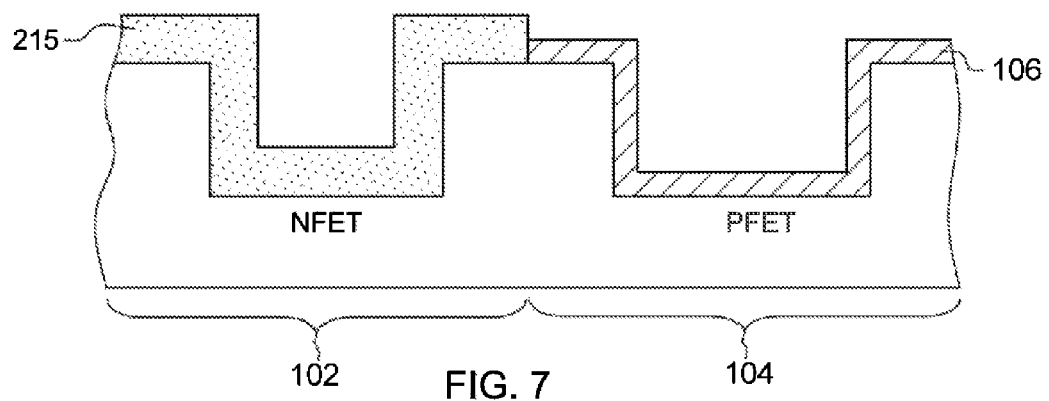

FIG. 6 illustrates, by way of example only, the removal of the amorphous silicon or polysilicon layer 218 and second work function layer 216 after the anneal. In a specific example, the polysilicon removal may be accomplished using an etching agent having an ammonia containing chemistry, and the second first work function layer is selectively etched to remove the same and expose the underlying dielectric layers; combined dielectric layer 215 above the NFET, and dielectric layer 214 above the PFET. This etching process may include processes such as, for example, reactive plasma etching. After removal of layers 216 and 218, dielectric layer 214 and work function layer 108 are removed above the PFET, leaving only dielectric layer 106 above the PFET. See FIG. 7. Conventional techniques for removal of the layers as discussed above for similar layers may be used.

Figure 8:
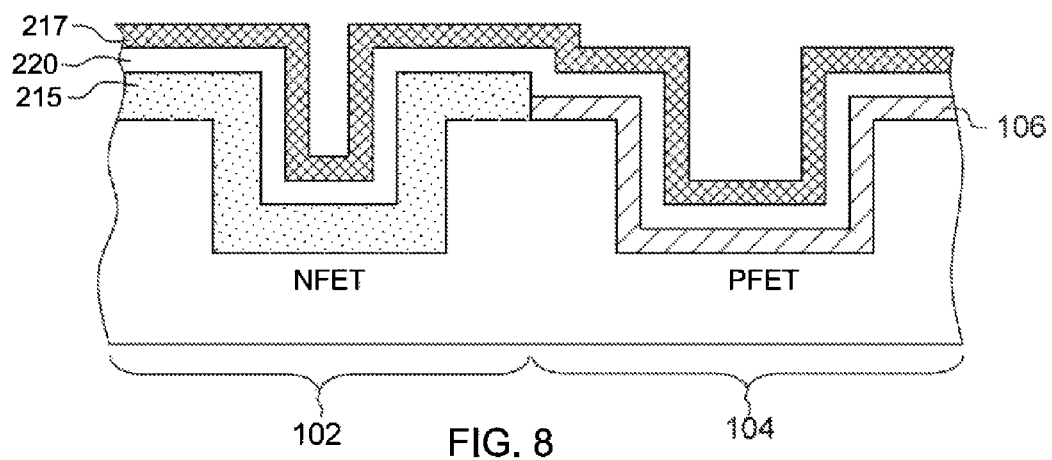

As shown in FIG. 8, removal of layers 108 and 104 above the PFET 208 may be followed by the deposition of a third work function layer 220 and an amorphous silicon or polysilicon layer 217 over the NFET and the PFET.

Figure 9:
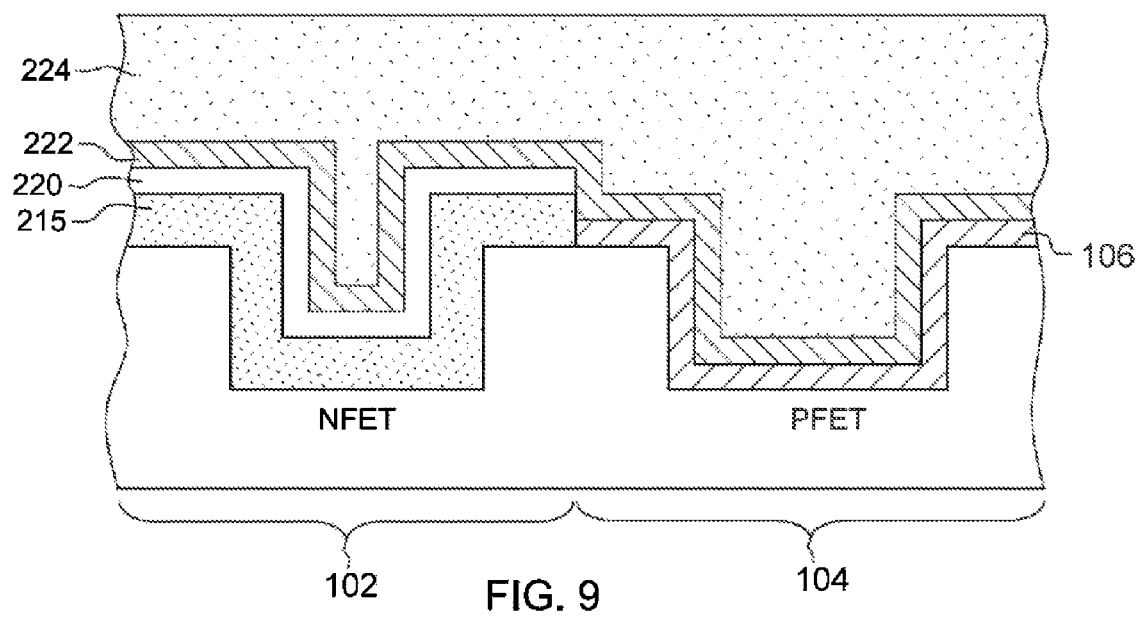

The third work function layer 220 may be formed, for example, by performing an atomic layer deposition (ALD) process, and, like the other work function layers, is a non-aluminum transition metal nitride, such as, for example, titanium nitride, having a thickness of about 20 Angstroms to about 100 Angstroms. Other possible transition metal nitrides lacking aluminum include those from Groups 4-6 in the Periodic Table, including, for example, tantalum nitride (TaN), niobium nitride (NbN), vanadium nitride (VN), tungsten nitride (WN), and the like. The third work function layer is annealed at a temperature of about 900° C. to about 1100° C. for a non-zero time of less than about one minute using laser spike annealing, decomposing the nitrogen gas created and leaving a titanium-rich film. This second anneal lowers the work function of the third work function layer and produces a corresponding threshold voltage downward shift of about 500 mV. The annealed third work function layer is then selectively etched using conventional techniques to remove it from above the PFET only, leaving a work function cap over the NFET only (see FIG. 9). Removal of the annealed third work function layer above the PFET effectively separates the threshold voltages of the NFET and PFET caused by the second anneal. Combined with the work function lowering from annealing to combine the dielectrics, the overall work function reduction and corresponding threshold voltage reduction for the NFET is about 600 mV to about 650 mV.

A fourth work function layer 222 may be formed over both the PFET and NFET, for example, using an atomic layer deposition (ALD) process. As with the other work function layers, the fourth work function layer is a non-aluminum transition metal nitride, such as, for example, titanium nitride, having a thickness of about 5 Angstroms to about 100 Angstroms. Other possible transition metal nitrides lacking aluminum include those from Groups 4-6 in the Periodic Table, including, for example, tantalum nitride (TaN), niobium nitride (NbN), vanadium nitride (VN), tungsten nitride (WN), and the like. A layer of conducting material 224, for example, W, Ni, Co, Ti, Al, or a salicide, is deposited over the fourth work function layer 222 by performing, for example, chemical vapor deposition, to act as a gate filler and also to reduce the total resistivity of the device. The thickness of the conducting material 224 depends on the circumstances, for example, the gate length, and may typically, in the case of tungsten, be about 200 Angstroms to about 4000 Angstroms in thickness. In the case of the conducting material 224 being aluminum, the thickness of the fourth work function layer 222 preferably has a thickness of greater than about 50 Angstroms to prevent Al diffusion.

While several aspects of the present invention have been described and depicted herein, alternative aspects may be effected by those skilled in the art to accomplish the same objectives. For example, one or more of the steps of the methods herein may be able to be performed in a different order and/or additional material layers may be added between the noted layers without affecting the overall purpose of the invention. Accordingly, it is intended by the appended claims to cover all such alternative aspects as fall within the true spirit and scope of the invention.

The invention claimed is:

1. A method, comprising:
   providing a semiconductor device comprising a n-type transistor and a p-type transistor;
   creating a first dielectric layer of at least one first dielectric material over the semiconductor device;
   depositing a first layer of work function material lacking aluminum over the transistors;
   altering a work function of the first layer of work function material by annealing; and
   separating work functions of the transistors by removing the first layer of work function material over one of the transistors.

2. The method of claim 1, wherein depositing the first layer of work function material comprises depositing a transition metal nitride lacking aluminum over the first dielectric layer, wherein the altering creates an annealed first work function layer, and wherein the removing comprises removing the annealed first work function layer over the p-type transistor only, exposing the first dielectric layer, the method further comprising depositing a second work function layer comprising a transition metal nitride lacking aluminum over the remaining annealed first work function layer and the exposed first dielectric layer.

3. The method of claim 2, wherein the first work function material comprises one of TiN, TaN, NbN, VN and WN, and has a thickness of about 10 Angstroms to about 100 Angstroms.

4. The method of claim 2, wherein the second work function material comprises one of TiN, TaN, NbN, VN and WN, and has a thickness of about 5 Angstroms to about 100 Angstroms.

5. The method of claim 2, wherein the anneal is performed at a temperature of about 900° C. to about 1100° C.

6. The method of claim 2, wherein the altering further comprises:
   prior to annealing, depositing a polysilicon or amorphous silicon layer over the first work function layer;
   after annealing, removing the polysilicon or amorphous silicon layer; and
   depositing a conducting layer over the second work function layer.

7. The method of claim 6, wherein the conducting layer comprises one of W, Ni, Co, Ti, Al and a salicide.

8. The method of claim 1, wherein depositing the first layer of work function material comprises depositing a transition metal nitride lacking aluminum over the first dielectric layer, wherein the altering creates an annealed first work function layer, and wherein the removing comprises removing the annealed first work function layer over the n-type transistor only, exposing the first dielectric layer.

9. The method of claim 8, further comprising:
   depositing a second dielectric layer of at least one second dielectric material over the n-type transistor and p-type transistor, wherein the at least one first dielectric material comprises a hafnium-based dielectric, and wherein the at least one second dielectric material comprises a lanthanum-based dielectric;
   depositing a second work function layer comprising a transition metal nitride lacking aluminum over the n-type transistor and the p-type transistor;
   depositing an oxygen barrier layer over the second work function layer; and
   annealing to combine the first dielectric layer and the second dielectric layer over the n-type transistor.

10. The method of claim 9, wherein the at least one first dielectric material comprises one of HfO2, HfSiON and HfSiO$_4$, and wherein the first dielectric layer has a thickness of about 10 Angstroms to about 25 Angstroms.

11. The method of claim 10, wherein the at least one second dielectric material comprises one of La$_2$O$_3$ and La$_2$SiO$_5$, and wherein the second dielectric layer has a thickness of about 1 Angstrom to about 10 Angstroms.

12. The method of claim 9, wherein the first layer of work function material comprises one of TiN, TaN, NbN, VN and WN, and has a thickness of about 10 Angstroms to about 100 Angstroms.

13. The method of claim 9, wherein the second work function layer comprises one of TiN, TaN, NbN, VN and WN, and has a thickness of about 5 Angstroms to about 100 Angstroms.

14. The method of claim 9, further comprising:
   removing the oxygen barrier and the second work function layer to expose the combined dielectric material over the n-type transistor and the second dielectric material over the p-type transistor;
   removing the second dielectric material and remaining first work function layer over the p-type transistor;
   depositing a third work function layer comprising a transition metal nitride lacking aluminum over the exposed dielectric materials;
   depositing an oxygen barrier layer over the third work function layer; and
   annealing to create an annealed third work function layer.

15. The method of claim 14, further comprising:
   after annealing, removing the oxygen barrier layer over the third work function layer;
   removing the annealed third work function layer over the p-type transistor only, exposing the layer of the first dielectric material;
   depositing a fourth work function layer comprising a transition metal nitride lacking aluminum over the remaining annealed third work function layer and the exposed first dielectric material; and
   depositing a conducting layer over the fourth work function layer.

* * * * *